United States Patent [19]

Vines et al.

[11] Patent Number: 5,610,105
[45] Date of Patent: Mar. 11, 1997

[54] DENSIFICATION IN AN INTERMETAL DIELECTRIC FILM

[75] Inventors: Landon B. Vines; Sigmund A. Koenigseder, both of San Antonio; John L. Cain, Taylor; Chang-Ou Lee; Felix Fujishiro, both of San Antonio, all of Tex.

[73] Assignee: VLSI Technology, Inc., San Jose, Calif.

[21] Appl. No.: 258,180

[22] Filed: Jun. 10, 1994

Related U.S. Application Data

[63] Continuation-in-part of Ser. No. 967,472, Oct. 23, 1992, abandoned.

[51] Int. Cl.$^6$ .................................................. H01L 21/316
[52] U.S. Cl. ........................... 437/235; 437/247; 437/238
[58] Field of Search ..................................... 437/238, 235, 437/240, 247, 248

[56] References Cited

U.S. PATENT DOCUMENTS

| | | | |
|---|---|---|---|
| 5,139,971 | 8/1992 | Giridhar et al. | 21/283 |
| 5,314,724 | 5/1994 | Tsukune et al. | 427/489 |

FOREIGN PATENT DOCUMENTS

| | | | |
|---|---|---|---|
| 1-176562 | 7/1989 | Japan | 21/316 |
| 2-219232 | 8/1990 | Japan | 21/316 |
| WO92/12535 | 7/1992 | WIPO | 21/312 |

OTHER PUBLICATIONS

"$H_2O$–TEOS Plasma–CVD Realizing Dielectrics Having a Smooth Surface." Hatanaka et al., IEEE VMIC Conference, pp. 435–441 (1991).
"Properties of Chemical Vapor Deposited TEOS Oxides . . . . Hydrogen Concentration", Nguyen, Ann Marie, J. Vac. Sci. Technol. B8(3) May/Jun. 1990 p. 533.
Wolf, Stanley "Silicon Processing for the VLSI Era", vol. 1, pp. 57–58 (1986).

*Primary Examiner*—Robert Kunemund
*Assistant Examiner*—Matthew Whipple
*Attorney, Agent, or Firm*—Karen S. Perkins

[57] ABSTRACT

An improved anneal process is disclosed for use in the preparation of a dielectric layer, especially an intermetal dielectric layer. An oxide layer is deposited using a $H_2O$-TEOS PECVD process. A vacuum bake is used to minimize or eliminate volatile water, hydrogen, and hydrocarbon impurities in the dielectric layer. An oxidation anneal is then performed to scavenge any remaining undesirable species, and to provide for densification of the dielectric layer.

18 Claims, No Drawings

DENSIFICATION IN AN INTERMETAL DIELECTRIC FILM

CROSS-REFERENCE TO RELATED APPLICATION

This is a continuation in part of the earlier U.S. patent application Ser. No. 07/967,472 (VLSI 1601), filed Oct. 23, 1992, abandoned the disclosure of which is hereby incorporated herein in its entirety.

TECHNICAL FIELD

This invention relates to the production and characteristics of layers used to form a semiconductor device. More specifically, the invention relates to an improved dielectric layer, especially an intermetal dielectric layer.

BACKGROUND OF THE INVENTION

Semiconductor chips include a multiplicity of conductive layers, semiconductive layers, and/or insulative layers. These multiple layers are deposited by various means, and etched or otherwise processed to produce electrical devices, such as transistors, on the surface of the silicon wafer. For example, to form an intermetal dielectric (IMD) layer, a dielectric (insulative) layer is formed on top of a conductive layer. A second conductive layer is then formed upon the dielectric layer. The layers may then be further processed, for example by etching. It is critical that an IMD layer be free of voids or holes which could cause unwanted shorting between conductive layers.

The resolution of small mask images has become increasingly difficult due to light reflection and the thinning of resist layers over wafer topography. Small variations in the topography of a layer can be multiplied with the multiplication of layers. A number of techniques are used to offset the effects of a varied wafer topography. One widely used technique is the use of planarization layers, which act to fill in voids in the wafer topography, and to provide a smoothed wafer surface. For example, a spun-on-glass (SOG) layer can be used to provide a planarizing dielectric layer. In SOG processes, a glass such as silicon dioxide in a fast-evaporating solvent is deposited on a semiconductor wafer using spinning equipment such as that used for photoresist processes. After it is applied to the wafer, the glass film is baked, leaving a planarized silicon dioxide film.

SOG technology has limitations in VLSI processing. The glass as spun is brittle. Inorganic SOG films thicker than 0.2 µm frequently crack during curing. Organic SOG films crack when exposed to oxygen plasma during resist-etching processes. It has therefore been desirable to provide a planarizing dielectric film by methods other than the traditional SOG methods.

CVD methods of producing a planarizing dielectric layer have been attempted, with some success. CVD-deposited silicon oxide films vary in structure and stoichiometry from thermally grown oxides. Depending on the deposition temperature, deposited oxides will have a lower density and different physical, chemical or mechanical properties, such as index of refraction, resistance to cracking, dielectric strength, and etch rate, when compared to thermally grown oxides. In many processes, the deposited film receives a high-temperature anneal in a process referred to as cure or densification. After the densification, the deposited silicon dioxide film is close to the structure and properties of a thermal oxide. However, high-temperature processing does not permit the use of underlying aluminum layers, which are adversely affected by temperatures above the melting point of aluminum (660° C.).

In medium-temperature ranges, plasma enhanced chemical vapor deposition (PECVD) equipment has been used to generate an IMD layer. The oxide source is tetraethylorthosilicate [$Si(OC_2H_5)_4$, TEOS]. TEOS is a type of silicon alkoxide that produces silicon dioxide through reaction with $H_2O$. Hatanaka et al. ("$H_2O$-TEOS Plasma CVD Realizing Dielectrics Having a Smooth Surface", VMIC Conference, p. 435–441, (IEEE, 1991), which is incorporated herein by reference in its entirety) have shown that a water-tetraethylorthosilicate oxide ($H_2O$-TEOS oxide) PECVD process, followed by a nitrogen anneal, can produce intermetal dielectric surfaces having planarization characteristics similar to spin-on-glass films, at moderate temperatures.

In order to provide a suitable surface for VLSI and ULSI devices, the IMD must be free of water, hydrogen, and residual hydrocarbons. However, the problem of charging effects due to water and residual hydrocarbons has been reported in PECVD TEOS oxide films that have high levels of water ($H_2$ and/or O—H bonds) and hydrocarbon (C—H bond) concentrations. The $H_2O$-TEOS deposited/nitrogen anneal films of Hatanaka et al. demonstrate an unacceptably high level of water and hydrocarbon bonds when tested with infrared spectra after deposition.

Deposited silicon dioxide films are used as dielectric layers in multimetallization schemes, as insulation between polysilicon and metallization layers, as doping barriers, as diffusion sources, and as isolation regions. A common use of these layers is as a dielectric layer between two layers of conducting metal. The intermetal dielectric film must provide a gap-free planarization of submicron spaces.

SUMMARY OF THE INVENTION

An improved anneal process is disclosed for use in the preparation of a dielectric layer, especially an intermetal dielectric layer. An oxide layer is deposited using a $H_2O$-TEOS PECVD process. A vacuum bake is then used to minimize or eliminate volatile species, such as water, hydrogen, and hydrocarbon impurities, in the dielectric layer. Finally, an oxidation anneal is performed to scavenge any remaining hydrocarbon bonds, and to provide densification of the dielectric layer.

DISCLOSURE OF THE INVENTION INCLUDING BEST MODE

The methods herein provide an improved dielectric layer on a silicon wafer. General processing of silicon wafers, to provide patterned conductive, semiconductive, and insulative layers, is well known in the art. The invention herein presents an improved method for providing an insulative layer on a silicon wafer, and especially an insulative layer which is positioned between two conductive (e.g. metal) layers.

A plasma-enhanced chemical vapor deposition (PECVD) apparatus is used to deposit a silicon dioxide layer on a semiconductor wafer. Any appropriate PECVD device, such as single-wafer systems, batch systems, or continuous-batch systems can be used. Horizontal vertical-flow PECVD devices can be used, as can barrel radiant-heated PECVD, or horizontal-tube PECVD devices. Cold-wall, parallel-plate PECVD reactors such as the Precision 5000 Mark II (Applied Materials, Santa Clara, Calif.) are generally preferred.

A plasma field is created within the PECVD device by the application of a radio frequency (RF). The RF power can be varied depending upon the time for the reaction, the quantities of reactants, the temperature, and the like. The RF input can be steady, or can be pulsed. In one preferred embodiment, the RF is pulsed, e.g., is varied periodically. As discussed in Hatanaka, pulse modulation is especially effective when the ratio of H₂O:TEOS is varied significantly from an optimized 4:1 ratio. Preferably, a pulsed input having a duty from about 0% to about 100%, more generally from about 50% to about 100% is used.

The RF power density and frequency will vary with the particular PECVD apparatus chosen. RF in the range of 100 kHz to 45.00 MHz is appropriate, more commonly in the range of 300 kHz to 13.56 MHz.

The source gases for silicon dioxide growth are H₂O and TEOS, with nitrogen (N₂) used as a carrier gas. The nitrogen carrier gas should generally conform to SEMI standards. The nitrogen carrier gas can include other inert gases, such as noble gases, if desired.

Semiconductor grade TEOS is available from a variety of sources, including from Schumacher (Carlsbad, Calif.). H₂O can be purchased, or can be purified, and generally should conform to SEMI standards.

The chemical reaction between H₂O and TEOS which produces the silicon dioxide film can be represented by the following formulas:

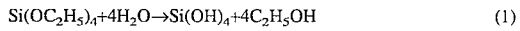
$$Si(OC_2H_5)_4 + 4H_2O \rightarrow Si(OH)_4 + 4C_2H_5OH \quad (1)$$

$$Si(OH)_4 \rightarrow SiO_2 + 2H_2O \quad (2)$$

Reaction (1) shows the mole ratio of 4 moles H₂O to 1 mole TEOS for a completed reaction. Therefore, the mole ratio of 4 moles H₂O to 1 mole TEOS is an optimum ratio for use herein. Other ratios, ranging from 1:1 to 10:1 H₂O:TEOS can be used, if desired.

The film deposition temperature under a plasma field is generally less than about 150° C. More generally, the temperature is between ambient room temperature (about 23° C.) and about 300° C. Lower temperatures (below about 150° C.) provide smooth dielectric layers, without the formation of grooves or voids, and without adverse effect on conductive layers, such as aluminum layers.

Partial pressure or vacuum is common for PECVD devices. Generally, the dielectric film will be deposited at a pressure between less than about 0.1 Torr and about 15 Torr. More generally, the film will be deposited between about 1 Torr and about 10 Torr. A pressure of about 3 Torr is especially suitable.

Following the PECVD deposition of a dielectric layer, the wafer is heated under a reduced pressure, such as a vacuum or partial vacuum. The vacuum bake acts to free water, hydrogen, and light molecular weight hydrocarbons from the intermetal dielectric film. The vacuum bake uses the volatilizing effects of reduced pressure and elevated temperature to cause the volatilization of undesired species. Generally, the lower the pressure, the lower the temperature can be to achieve a given purity in a given amount of time. Similarly, the time necessary to achieve a given purity can be decreased as the pressure is decreased, and/or the temperature is increased.

The vacuum bake step can take place in any appropriate apparatus which can provide both reduced pressure and increased temperature. For example, a horizontal tube furnace or vertical tube furnace can be used. Such furnaces can be single-wafer systems, batch systems, or continuous-batch systems. Horizontal tube furnaces include the Thermco TMX-10000, SVG (Orange, Calif.). Vertical tube furnaces are available, for example, from Tel (Japan), Kokusai (Japan), or SVG (Orange, Calif.). Conveniently, the vacuum bake step can be done in the same apparatus as that used for the subsequent oxidation anneal step.

The temperature for the vacuum bake is generally from about 200° C. or less to about 450° C. or more. Preferably, the temperature is between about 350° C. and about 450° C.

The vacuum bake is generally performed in a reduced pressure environment, such as a vacuum or partial vacuum. At partial vacuums above about 10 torr, the time and temperatures required to attain a given purity will be less desirable than at lower torr. Generally, the pressure should be less than about 5.0 torr, more generally less than about 1.0 torr. Preferably, the pressure is about 0.01 torr or less.

The vacuum bake can be executed in a traditional hot wall tube type furnace, or in a vertical type furnace. In such furnaces, the vacuum bake step will generally require heating for a period of about 20 minutes or less to about 2 hours or more. More preferably, the vacuum bake will take from about 30 minutes to about 60 minutes.

The vacuum bake step can be done in a rapid thermal anneal (RTA) type chamber for a period of about 10 seconds or less to about 2 minutes or more. More preferably, the vacuum bake in an RTA apparatus will take from about 30 seconds to about 60 seconds.

Following the vacuum bake process, an oxidation anneal is performed. This oxidation anneal acts to oxidize and remove any remaining hydrocarbon in the dielectric layer and to improve the silicon oxide quality.

The oxidation anneal is generally performed under ambient pressure. The oxidation anneal can take place under a stream which includes an inert gas such as nitrogen, a noble gas, or combination of such gases. Generally, from less than about 1 vol. % to 100 vol. % oxygen gas is present in the nitrogen. More preferably, the oxidation anneal takes place in an environment which includes from less than about 1 vol. % to more than about 20 vol. % oxygen gas. The oxygen gas provided can be in the form of oxygen gas (O₂), or in the form of oxygen gas (O₂) which includes an ozone (O₃) content. In a preferred embodiment, the oxygen provided includes from about 85% to about 95% O₂, and from about 5% to about 15% O₃.

The temperature for the oxidation anneal is generally from about 175° C. or less to about 450° C. or more. Preferably, the temperature is between about 200° C. and about 400° C. in a cold-wall apparatus.

The oxidation anneal step can be done in a rapid thermal anneal (RTA) type chamber for a period of about 10 seconds or less to about 2 minutes or more. More preferably, the vacuum bake in an RTA apparatus will take from about 30 seconds to about 60 seconds. The temperature for the oxidation anneal in an RTA chamber is generally from about 375° C. or less to about 475° C. or more. Preferably, the temperature is between about 400° C. and about 450° C. in a cold-wall apparatus.

The vacuum bake followed by the oxidation anneal process allows the PECVD deposited silicon dioxide film to have improved dielectric properties, while minimizing the amount of water, hydrogen, and hydrocarbon present. The relatively low temperature anneal processes herein do not stress the barrier metal structures or cause spiking in the contacts at source/drain junctions. The two-step anneal process also provides a more reliable film, with less tendency to exhibit a charging effect ($V_t$ shift) in the finished device.

For purposes of clarity and example only, and not by way of limitation, the process will be described with reference to specific apparatus, times, temperatures, and reactant quantities. It will be understood that while specific time, reaction quantities or rates, temperatures, pressure, RF input, and the like, will vary with the apparatus used, the principles described herein can be easily modified and will be applicable to a variety of different specific PECVD devices.

EXAMPLE 1

PECVD Process

A silicon wafer is placed on the lower electrode of an Applied Materials Precision 5000 PECVD apparatus (Applied Materials, Santa Clara, Calif.), a cold-wall parallel plate plasma CVD reactor. In accordance with manufacturers directions, a source gas of 120 sccm $H_2O$ and 30 sccm TEOS are charged to the input line. 400 sccm $N_2$ is charged to the carrier line. The wafer chamber is pressurized to 10 Torr, heated to 37° C., and 300 W RF power is applied to the upper electrode. The RF is pulsed, with a duty cycle of 30%. A layer of dielectric material is deposited on the wafer.

EXAMPLE 2

Nitrogen Anneal Process (Prior Art)

A silicon wafer of Example i is annealed at 450° C. for 30 minutes in a nitrogen atmosphere, according to the process of Hatanaka et al. (supra), the disclosure of which is herein incorporated by reference.

An IR absorbence analysis is performed. As shown in Hatanaka, FIG. 8, peaks corresponding to O—H, C—H and/or $H_2$ are present.

EXAMPLE 3

Vacuum Bake Process

A silicon wafer of Example 1 is placed in a Thermco TMX-10000, SVG (Orange, Calif.) horizontal tube furnaces. The pressure is held 0.01 torr, and the temperature is held at 400° C. for 30 minutes.

EXAMPLE 4

RTA Vacuum Bake Process

A silicon wafer of Example 1 is placed in a Heatpulse™ 4100 (AG Associates, San Jose, Calif.) rapid thermal anneal (RTA) chamber, which is modified by the addition of a vacuum pump. The pressure is held 0.01 torr, and the temperature is 400° C. for 60 seconds.

EXAMPLE 5

Oxidation Anneal Process

A silicon wafer of Example 3 is retained in the Thermco TMX-10000. A stream of gases which includes 20 vol. % oxygen gas, and the balance inert gases, is introduced into the heating chamber. The oxygen portion of the gas stream includes 10% $O_3$. The temperature is maintained at 300° C. for 30 minutes.

An IR absorbence analysis is performed. No peaks corresponding to O—H, C—H or $H_2$ are present.

EXAMPLE 6

RTA Oxidation Anneal Process

A silicon wafer of Example 4 is retained in the Heatpulse™ 4100 apparatus. A stream of gases which includes 20 vol. % oxygen gas, and the balance inert gases, is introduced into the heating chamber. The oxygen portion of the gas stream includes 10% $O_3$. The temperature is maintained at 300° C. for 30 seconds.

An IR absorbence analysis is performed. No peaks corresponding to O—H, C—H or $H_2$ are present.

While the invention has been described in connection with several exemplary embodiments, it will be understood that many modifications will be apparent to those of ordinary skill in the art in light of the above disclosure. Reference to the following claims should be made to determine the scope of the claimed invention.

We claim:

1. A process for preparing a dielectric layer on a silicon wafer, said process comprising:
   (a) depositing a dielectric layer on a silicon wafer using water and TEOS in a plasma-enhanced chemical vapor deposition apparatus;
   (b) thermally heating the silicon wafer including the dielectric layer produced by step (a) under reduced pressure; and
   (c) annealing the dielectric layer on the silicon wafer of step (b) under an atmosphere including oxygen gas.

2. A process of claim 1 wherein the dielectric layer is an intermetal dielectric layer.

3. A process of claim 1 wherein the dielectric layer is a silicon dioxide layer.

4. A process of claim 1 wherein the heating step is conducted at a temperature of from about 200° C. to about 450° C.

5. A process of claim 4 wherein the heating step is conducted at a temperature between about 350° C. and about 450° C.

6. A process of claim 1 wherein the heating step is conducted at a pressure of less than about 10 torr.

7. A process of claim 6 wherein the heating step is conducted at a pressure of less than about 1 torr.

8. A process of claim 6 wherein the heating step is conducted at a pressure of less than about 0.1 torr.

9. A process of claim i wherein the annealing step is conducted in an atmosphere comprising from about 1% to about 100% oxygen gas, and from about 0% to about 99% inert gas.

10. A process of claim 9 wherein the annealing step is conducted in an atmosphere comprising from about 1% to about 15% ozone.

11. A process of claim 9 wherein the inert gas is selected from the group consisting of nitrogen, the noble gases, and mixtures thereof.

12. A process of claim 9 wherein the annealing step is conducted in an atmosphere comprising from about 20% to about 50% oxygen gas, and from about 50% to about 80% inert gas.

13. A process of claim 12 wherein the inert gas is selected from the group consisting of nitrogen, the noble gases, and mixtures thereof.

14. A process of claim 1 wherein the heating step (b) is conducted at a pressure of less than 0.01 torr.

15. A process of claim 4 wherein the heating step (b) is conducted in a traditional furnace apparatus for a time of about 30 minutes to about 60 minutes.

16. A process of claim 4 wherein the heating step (b) is conducted in a rapid thermal anneal chamber for a time of 30 seconds to 60 seconds.

17. A process of claim 1 wherein the annealing step (c) is conducted at a temperature between about 200° C. to about 400° C.

18. A process for preparing a dielectric layer on a silicon wafer, said process comprising:
   (a) depositing a dielectric layer on a silicon wafer using water and TEOS in a plasma-enhanced chemical vapor deposition apparatus;
   (b) thermally heating the silicon wafer including the dielectric layer produced by step (a) under reduced pressure, said heating being conducted at a temperature of from about 200° C. to about 450° C. and said reduced pressure being less than about 0.1 torr; and
   (c) annealing the dielectric layer on the silicon wafer of step (b) under an atmosphere including oxygen gas.

* * * * *